United States Patent
Ferran et al.

(10) Patent No.: US 7,129,858 B2
(45) Date of Patent: Oct. 31, 2006

(54) ENCODING SYSTEM

(75) Inventors: Jordi Ferran, Barcelona (ES); Xavier Soler, Barcelona (ES); Carles Boy, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 271 days.

(21) Appl. No.: 10/683,817

(22) Filed: Oct. 10, 2003

(65) Prior Publication Data

US 2005/0078015 A1  Apr. 14, 2005

(51) Int. Cl.
  *H03M 1/22* (2006.01)
  *G01D 5/34* (2006.01)
(52) U.S. Cl. .................. 341/11; 341/7; 250/231.18
(58) Field of Classification Search ............... 341/6, 341/7, 11; 250/231.13, 231.14, 231.16, 231.18
See application file for complete search history.

(56) References Cited

U.S. PATENT DOCUMENTS

| | | | |
|---|---|---|---|
| 4,786,803 A | 11/1988 | Majette et al. | |
| 4,789,874 A | 12/1988 | Majette et al. | |
| 5,206,645 A | 4/1993 | Urich | |
| 5,239,177 A * | 8/1993 | Cunniff | 250/231.18 |
| 5,300,961 A | 4/1994 | Corona et al. | |
| 5,411,340 A | 5/1995 | Elgee | |
| 5,565,864 A * | 10/1996 | Ohno et al. | 341/1 |
| 5,587,771 A | 12/1996 | Mori et al. | |
| 5,929,789 A * | 7/1999 | Barbehenn | 341/11 |
| 6,089,693 A | 7/2000 | Drake et al. | |
| 6,155,669 A * | 12/2000 | Donahue et al. | 347/42 |
| 6,246,050 B1 * | 6/2001 | Tullis et al. | 250/231.13 |
| 6,335,748 B1 | 1/2002 | Furst | |

FOREIGN PATENT DOCUMENTS

JP   11245383 A  *  9/1999

* cited by examiner

*Primary Examiner*—Howard L. Williams

(57) ABSTRACT

An encoding system for determining position and position changes of a moving member has a sequence of encoder marks forming incremental patterns and at least one index pattern. Two subsequent incremental patterns are indicative of an incremental position-change of the moving member and the index pattern is indicative of a reference position of the moving member. A sensor arrangement views a section of the encoder-mark sequence, the length of which is greater than one position-change increment. An analyzer is arranged to analyze an encoder-mark pattern in the viewed section with regard to the incremental patterns and the index pattern and to generate, in response to a pattern match found, at least one of an incremental-position-change signal and an index signal.

35 Claims, 8 Drawing Sheets

| | viewed pattern | incremental signal | index signal |
|---|---|---|---|
| P1 | | 10101010101 | 1 | 0 |
| P2 | | 01010101010 | 0 | 0 |
| P3 | | 00101010101 | 1 | 0 |
| P4 | | 00010101010 | 0 | 0 |
| P5 | | 10001010101 | 1 | 0 |
| P6 | | 11000101010 | 0 | 0 |
| P7 | | 11100010101 | 1 | 0 |
| P8 | | 11110001010 | 0 | 0 |
| P9 | | 11111000101 | 1 | 0 |
| P10 | | 01111100010 | 0 | 0 |
| P11 | | 00111110001 | 1 | 0 |
| P12 | | 00011111000 | 0 | 1 |
| P13 | | 10001111100 | 1 | 0 |
| P14 | | 01000111110 | 0 | 0 |
| P15 | | 10100011111 | 1 | 0 |
| P16 | | 01010001111 | 0 | 0 |
| P17 | | 10101000111 | 1 | 0 |
| P18 | | 01010100011 | 0 | 0 |
| P19 | | 10101010001 | 1 | 0 |
| P20 | | 01010101000 | 0 | 0 |
| P21 | | 10101010100 | 1 | 0 |
| P2 | | 01010101010 | 0 | 0 |
| P1 | | 10101010101 | 1 | 0 |

Fig. 5

| | viewed pattern | incremental signal | index signal |
|---|---|---|---|
| R1  | ▫▪▫▪▪ | 010101 | 1 | 0 |
| R2  | ▪▫▪▫▪▫ | 101010 | 0 | 0 |
| R3  | ▪▪▫▪▫▪ | 110101 | 1 | 0 |
| R4  | ▪▪▪▫▪▫ | 111010 | 0 | 1 |
| R5  | ▫▪▪▪▫▪ | 011101 | 1 | 0 |
| R6  | ▫▫▪▪▪▫ | 001110 | 0 | 0 |
| R7  | ▫▫▫▪▪▪ | 000111 | 1 | 1 |
| R8  | ▪▫▫▫▪▪ | 100011 | 0 | 0 |
| R9  | ▫▪▫▫▫▪ | 010001 | 1 | 0 |
| R10 | ▪▫▪▫▫▫ | 101000 | 0 | 0 |
| R11 | ▫▪▫▪▫▫ | 010100 | 1 | 0 |
| R2  | ▪▫▪▫▪▫ | 101010 | 0 | 0 |
| R1  | ▫▪▫▪▫▪ | 010101 | 1 | 0 |

US 7,129,858 B2

ENCODING SYSTEM

FIELD OF THE INVENTION

The present invention relates generally to encoding systems and, for example, to encoding systems and methods for determining position and position changes of a moving member and to printing devices with such encoding systems.

BACKGROUND OF THE INVENTION

Encoding systems for sensing relative movements usually have a row of equidistantly spaced encoder marks attached to a first member and a sensor arrangement attached to a second member which is movable with relation to the first one. When the encoding marks move past the sensor arrangement signals according to the detected marks are generated. By counting the signals, information regarding the position change between the two members (i.e. relative-position information) is obtained.

An example of such a system is a wheel with radial encoder marks mounted on a rotating axle, for example a pulley axle of a belt arrangement in an ink-jet printer. Each time a mark passes an (e.g. optical or magnetic) sensor, a signal is generated which indicates that the wheel has turned by one mark. Another example is a belt of an ink-jet printer equipped with a linear row of encoder marks. Each encoder signal indicates a belt advance of one mark. However, if all marks are identical, no absolute-position information is provided by such an encoder system.

In order to provide absolute-position information, it is known to equip an encoder with at least one index mark (or "reference mark"). Two types are known:

In double-channel (or multi-channel) encoders, the encoding marks and the reference mark are separately arranged and viewed by individual sensors (for example, U.S. Pat. No. 5,206,645, FIG. 3).

In single-channel encoders, the different marks are arranged in one single encoder scale. Examples of such single-channel encoders are, for example, described in U.S. Pat. Nos. 4,786,803, 4,789,874, 5,206,645 and 5,411,340. In these single-channel encoders, the index mark is wider than the encoder marks, and in some of them one or more of the encoder marks are "hidden" by the index mark. The sensor generates different signals for the marks of different widths, which enables the two types of marks to be distinguished. According to U.S. Pat. No. 5,411,340, the virtual position of the hidden encoder mark is estimated.

SUMMARY OF THE INVENTION

A first aspect of the invention is directed to an encoding system for determining position and position changes of a moving member. According to the first aspect, the encoding system comprises a sequence of encoder marks forming incremental patterns and at least one index pattern, wherein two subsequent incremental patterns are indicative of an incremental-position-change of the moving member and the index pattern is indicative of a reference position of the moving member. The system further comprises a sensor arrangement viewing a section of the encoder-mark sequence, the length of which is greater than one position-change increment and an analyzer arranged to analyze an encoder-mark pattern in the viewed section with regard to the incremental patterns and the index pattern and to generate, in response to a pattern match found, at least one of an incremental-position-change signal and an index signal.

According to another aspect, an encoding system is provided for determining position and position changes of a moving member. The encoding system comprises a row of encoder marks arranged along the moving member in a generally regular manner to provide incremental-position-change information. The system further comprises at least one index marking in the form of a predefined pattern of encoder marks which represents a disturbance of the regular encoder-mark arrangement and a sensor arrangement viewing a section of the row of encoder marks and arranged to provide a viewed pattern of the encoder-mark section. The system further comprises an analyzer arranged to analyze the viewed pattern to generate incremental-position-change signals on the basis of the encoder marks and an index signal in response to a detection of the predefined index mark pattern. The incremental-position-change signals are also able to be generated also in that section of the encoder-mark row in which the regular encoder-mark arrangement is disturbed by the index marking.

According to another aspect, an encoding system is provided for determining position and position changes of a moving member. The encoding system comprises a row of identical encoder marks forming incremental patterns and at least one index pattern, wherein two subsequent incremental patterns are indicative of an incremental position-change of the moving member and the index pattern is indicative of a reference position of the moving member. The system further comprises a sensor arrangement detecting a pattern of a section of the encoder-mark row and an analyzer arranged to analyze the detected encoder-mark pattern with regard to the incremental patterns and the index pattern and to generate, in response to an incremental-pattern match found, an incremental-position-change signal and, in response to an index-pattern match found, an index signal.

According to another aspect, a printing device is provided having an encoding system for determining position and position changes of a moving recording medium conveyor to determine the position of a recording medium placed on the conveyor. The encoding system comprises a sequence of encoder marks forming incremental patterns and at least one index pattern, wherein two subsequent incremental patterns are indicative of an incremental position-change of the moving member and the index pattern is indicative of a reference position of the moving member. The system further comprises a sensor arrangement viewing a section of the encoder-mark sequence, the length of which is greater than one position-change increment and an analyzer arranged to analyze an encoder-mark pattern in the viewed section with regard to the incremental patterns and the index pattern and to generate, in response to a pattern match found, at least one of an incremental-position-change signal and an index signal.

According to another aspect, a printing device is provided having an encoding system for determining position and position changes of a moving member to determine the position of a recording medium placed on the conveyor. The encoding system comprises a row of encoder marks arranged along the moving member in a generally regular manner to provide incremental-position-change information. The system further comprises at least one index marking in the form of a predefined pattern of encoder marks which represents a disturbance of the regular encoder-mark arrangement and a sensor arrangement viewing a section of the row of encoder marks and arranged to provide a viewed pattern of the encoder-mark section. The system further comprises an analyzer arranged to analyze the viewed pattern to generate incremental-position-change signals on the basis of the encoder marks and an index signal in response to a detection of the predefined index mark pattern. The incremental-position-change signals are enabled to be generated also in that section of the encoder-mark row in which the regular encoder-mark arrangement is disturbed by the index marking.

According to another aspect, a printing device is provided having an encoding system for determining position and position changes of a moving member to determine the position of a recording medium placed on the conveyor. The encoding system comprises a row of identical encoder marks forming incremental patterns and at least one index pattern, wherein two subsequent incremental patterns are indicative of an incremental position-change of the moving member and the index pattern is indicative of a reference position of the moving member. The system further comprises a sensor arrangement detecting a pattern of a section of the encoder-mark row and an analyzer arranged to analyze the detected encoder-mark pattern with regard to the incremental patterns and the index pattern and to generate, in response to an incremental-pattern match found, an incremental-position-change signal and, in response to an index-pattern match found, an index signal.

According to another aspect, a method is provided of determining position and position changes of a moving member using a sequence of encoder marks which forms incremental patterns and at least one index pattern, wherein two subsequent incremental patterns are indicative of an incremental position-change of the moving member and the index pattern is indicative of a reference position of the moving member, comprising the steps: viewing a section of the encoder-mark sequence, the length of which is greater than one position-change increment; analyzing an encoder-mark pattern in the viewed section with regard to the incremental patterns and the index pattern; and generating, in response to a pattern match found, at least one of an incremental-position-change signal and an index signal.

According to another aspect, a method is provided of determining position and position changes of a moving member using a row of encoder marks arranged along the moving member in a generally regular manner to provide incremental-position-change information; at least one index marking in the form of a predefined pattern of encoder marks which represents a disturbance of the regular encoder-mark arrangement, comprising the steps: viewing a section of the row of encoder marks; providing a viewed pattern of the encoder-mark section; analyzing the viewed pattern to generate incremental-position-change signals on the basis of the encoder marks and an index signal in response to a detection of the predefined index mark pattern. The incremental-position-change signals are enabled to be generated also in that section of the encoder-mark row in which the regular encoder-mark arrangement is disturbed by the index marking.

Other features are inherent in the methods and products disclosed or will become apparent to those skilled in the art from the following detailed description of embodiments and its accompanying drawings.

DESCRIPTION OF THE DRAWINGS

Embodiments of the invention will now be described, by way of example, and with reference to the accompanying drawings, in which:

FIG. 5 shows different possible viewed patterns, when the index marking of FIG. 4 is used, and illustrates one embodiment of a pattern analyzer arranged to generate incremental and index signals in dependence on the viewed pattern.

DESCRIPTION OF THE PREFERRED EMBODIMENTS

Figure 1:
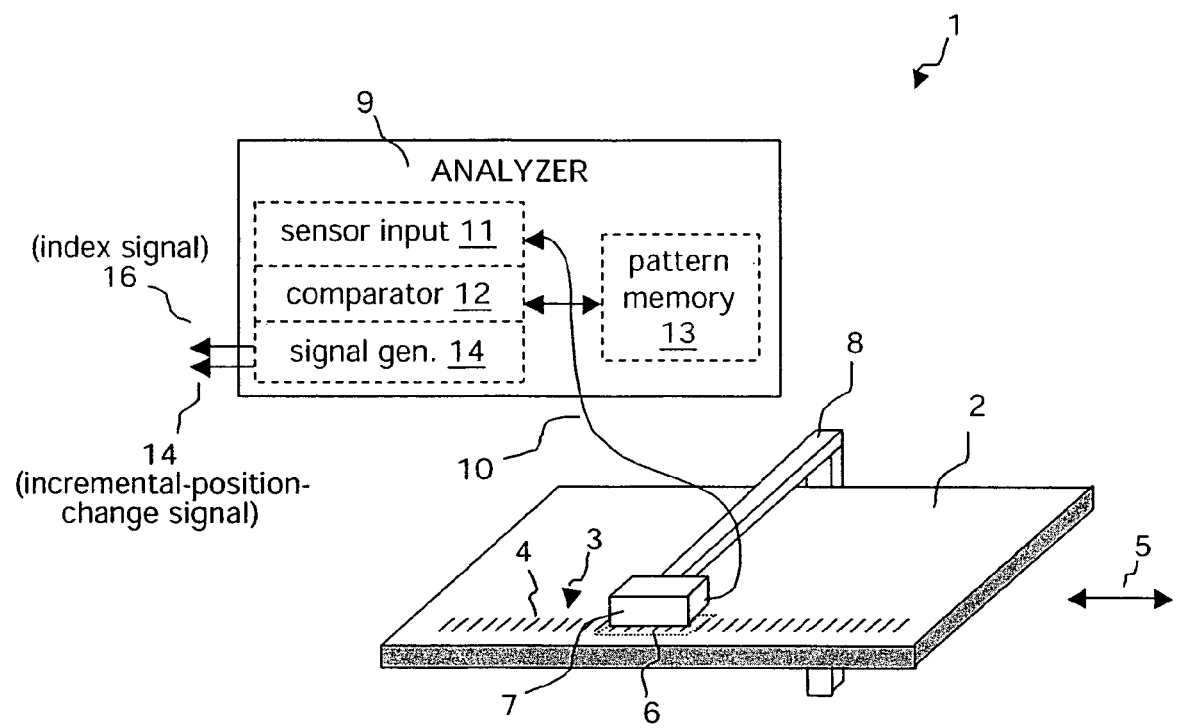
FIG. 1 illustrates a linear-encoding system.
Figure 2:
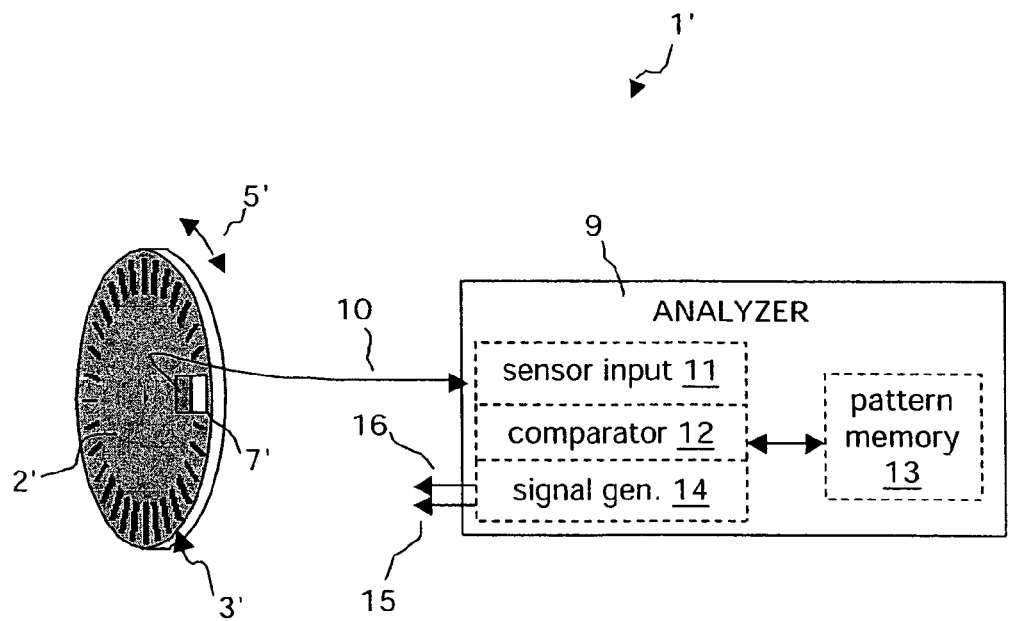
FIG. 2 illustrates an angular encoding system.

FIGS. 1 and 2 illustrate linear and angular encoding systems. Before proceeding further with the detailed description of FIGS. 1 and 2, however, a few items of the embodiments will be discussed.

In the embodiments, the encoding system has encoder marks arranged in a sequence (or row) which are fixed to a moving member or a complementary non-moving member. The encoder marks used in a particular embodiment are equal, and they are regularly (equidistantly) arranged (except for an index marking region, as will be explained below). A sensor arrangement views the encoder-mark row. Each time an encoder mark passes a sensor of the sensor arrangement, a signal is generated. At least in the region outside the index marking each signal of a particular sensor represents an advance of the moving member by one encoding mark distance. Accordingly, incremental counting of these signals, in principle, enables position changes of the moving member (or its "relative position") to be determined; the position change corresponds to the encoding mark distance times the number of counted signals (actually, in the embodiments, the incremental position-change-signals are not simply based on individual sensor signals, but rather on certain combinations (or patterns) of signals from the different sensors of the sensor arrangement, as will be explained below).

In order to obtain an absolute position indication, an index (or reference) marking is also provided. It is indicative of a particular reference point on the (generally longitudinally extended) moving member, called "reference position". By starting the incremental counting at the index marking, i.e. by combining the absolute reference-position information of the index marking and the relative position information of the accumulated position-change signals, any position of the moving member can be absolutely determined.

In some of the preferred embodiments the encoding system has only one index marking to provide unambiguous absolute position information. If, however, index marking ambiguities can be resolved, two or more index markings may be provided; (for example, in a printer with several print stations equipped with sensors responsive to index markings, the ambiguity between a plurality of index markings can be effectively resolved if the distance between index markings is larger than the distance between the print stations).

In the preferred embodiments, the index marking is not arranged in a separate channel and has no mark with a shape different from the encoder marks. Rather, the index marking is a predefined pattern formed by equal encoder marks which can be considered as a disturbance of the regular encoder-mark arrangement. Consequently, the encoder-mark arrangement is strictly regular only in those regions of the encoder-mark row which are not disturbed by the index pattern; the entire arrangement (including the index marking) is called "generally regular".

The embodiments described enable relative position information (based on incremental signals) and absolute position information (based on index signals) to be obtained with a smaller relative error than in conventional systems which used different sensors or encoder marks of different shape or size to distinguish between incremental and index markings. In the embodiments, identical markings and one and the same sensor arrangement is used to detect both incremental and index markings which helps reduce possible systematic shifts between the relative and absolute position determination. Unlike systems with separate sensors for encoding and index marks, the relative error between the detected encoding marks and the index marking is zero or negligible, and practically no systematic or random errors are present, in the embodiments. Accordingly, when the embodiments of the encoding system, for example, are used in printers, the image registration between different print stations and, consequently, the achievable image quality, may be improved.

The sensor arrangement views a section of the encoder-mark row. It is arranged to provide information representative of the pattern of the viewed encoder-mark section also called the viewed or detected pattern).

In the preferred embodiments, the sensor arrangement has a plurality of sensor elements which simultaneously view a plurality of fields of the encoder-mark row, and, accordingly, can simultaneously detect a plurality of encoder marks in the viewed encoder-mark section.

In other embodiments the sensor arrangement has a sensor which successively detects individual encoder marks (or sub-sections) of the encoder-mark section upon a movement of the moving member. The encoding system combines the successively detected encoder marks to form a representation of the encoder-mark pattern in the section. Embodiments with successive detection of encoder marks are less preferred since the complete encoder-mark pattern is only obtained with a delay since a full pattern is only known when the last encoder mark of the section has been detected.

The length of the index pattern is chosen such that the encoder-mark pattern and the index pattern can be distinguished (i.e. the two patterns are orthogonal or quasi-orthogonal, even in the presence of noise (e.g. erroneously detected or not detected marks)). In some of the embodiments, the length of the viewed encoder-mark section corresponds to the length of the index marking. However, if a unique identification of the index marking, even in the presence of noise, is already enabled by a part of the index marking, it may be sufficient to view only an encoder-mark section shorter than the length of the index marking. Conversely, to improve robustness against noise, in some embodiments the length of the viewed encoder-mark section is larger than the length of the index marking.

An analyzer receives the pattern information detected by the sensor arrangement. The analyzer is, for example, a digital processor which compares viewed patterns with stored predetermined patterns and finds matches between them. The analyzer may be a device especially dedicated to the pattern analysis. Alternatively, it may be part of another device, e.g. a controller of an apparatus (e.g. a printer) with which the encoding system is associated. For example, the analyzer may then be a process executed in the controller besides other processes. The analyzer generates encoder signals which indicate the incremental position-changes of the moving member on the basis of the encoder marks. Furthermore, it generates an index signal in response to a detection of the predefined index mark pattern.

In the embodiments, the sensor arrangement detects a multiplicity of encoder marks in the viewed section, although, in principle, one encoder mark would be sufficient to generate an encoder signal providing incremental position-change information. In other words, the detected multiplicity of encoder marks carry redundant incremental position-change information at least in regions of regular encoder-mark arrangement (i.e. in regions in which the regular encoder-mark arrangement is not disturbed by the index marking). The disturbed region includes additional information, e.g. the index marking. Although this reduces or even takes away the redundancy of the incremental position-change information, sufficient incremental-position-change information is still included to enable incremental position-change signals to be generated even in that part of the encoder-mark arrangement which is disturbed by the index marking.

Considering the index marking as a disturbance of a regular encoder-mark arrangement (as above) is one possible way to describe the encoding system of the embodiments. Another possible description treats the generation of the incremental-position-change signals and the generation of the index signal in an equal manner. In this alternative description, the encoder-mark row is considered to form incremental patterns and at least one index pattern. Two subsequent incremental patterns are indicative of an incremental position-change of the moving member. The index pattern is indicative of the moving member's absolute reference position. By definition, the incremental patterns and the index pattern may be considered to have equal lengths. In the embodiments, one unit of incremental position-change is smaller than the length of the incremental pattern, which means that subsequent incremental patterns overlap. The section of the encoder-mark row viewed by the sensor arrangement is greater than one such position-change increment. Preferably, the length of the viewed encoder-mark section is equal to the length of the incremental patterns and the index pattern, but it may also be greater or smaller than that. The analyzer "knows" all predefined patterns (i.e. the incremental patterns and the index pattern) and generates, in response to an incremental-pattern match found, an incremental-position-change signal, and, in response to an index-pattern match found, an index signal.

In the embodiments, the encoder marks are identical. For example, if the encoding system is an optical system, the encoder marks have the same shape, size and color and the same orientation on the moving member. Accordingly, the index mark is not defined by special marks, but by a special pattern of the identical encoder marks.

In some of the embodiments, the encoding system is an angular system in which the encoder marks are arranged in a circular row on a rotating member. In other embodiments the encoding system is linear; the encoder marks are arranged in a linear row parallel to the moving member's advance direction; their orientation is typically perpendicular to the advance direction (but the marks may be inclined to the advance direction if lateral displacements of the moving member are also to be detected). Of course, the term "moving member" does not imply that the member is necessarily rigid. Rather, the member may be flexible, such as, for example, a conveying belt in a printer or a print medium (e.g. paper) on which the encoder marks are printed.

The described encoding system may, for example, be used in devices in which a moving member has to be accurately positioned (such as in robots) or the position of a moving member has to be accurately known (such as in printing scanning measurement devices). For example, in an embodiment of a printing device described below, the encoding system is used for determining position (i.e. the absolute reference position) and position changes (i.e. the relative position) of a recording medium conveyor, which is, for example, a belt or drum conveyor. Preferably, the encoding system when used in a printing device will determine the position of a recording medium placed on and moved by the conveyor. By measuring the recording medium's position relative to the conveyor by means of an additional sensor (e.g. a media presence sensor) and assuming that the recording medium does not move relative to the conveyor, a precise measurement of the conveyor's position and position changes is an indirect precise measurement of the recording medium's position and position changes. The sensor for example can be either placed in fixed position to sense the entire width of the medium in one reading or parked in a side position to sense the entire width of the medium in a scanning movement, by means of a motor, in a direction perpendicular to the medium advance direction. The row of encoder marks is arranged along the conveyor. The printing device is a multicolor printer with a plurality of page-wide print stations which extend over the recording medium conveyor and are spaced from one another in the advance direction. Each print station is individually equipped with a sensor arrangement, and an analyzer of the kind described above is associated with each print station. The sensor arrangements view the same row of encoder marks, but, due to the spaced arrangement of the print stations, different sections of the encoder-mark row which are adjacent to the respective print station. Such a print-station-individual measurement of the conveyor's relative and absolute position enables a precise registration of the images printed by the spaced print stations onto each other, which improves the image quality. The improvement achieved by such a print-station-individual measurement is particularly advantageous with non-rigid conveyors, such as belt conveyors. For example, a belt may carry out oscillatory movements with a component in a direction perpendicular to the recording-medium-advance direction, and it may expand and shrink in the advance direction (e.g. due to temperature changes), which could generally introduce registration errors between the print stations. The described print-station-individual measurement limits the amount of registration errors introduced between the print stations.

For certain applications, two orthogonal encoding systems of the kind described may be used. For example, in order to enable the absolute position of a movable tool on a two-dimensional surface (e.g. a table) to be determined, two orthogonal edges of the table may be equipped with rows of encoding marks, each including an index marking, as described herein.

Returning now to FIGS. 1 and 2, encoding systems 1, 1' trace position and position changes of a moving member 2, 2'. FIG. 1 illustrates a linear-encoding system, and FIG. 2 an angular encoding system. The moving member 2 of the linear system shown in FIG. 1 bears a linear row 3 composed of individual encoder marks 4. The encoder marks 4 are in the shape of short strokes or lines perpendicular to an advance direction of the moving member 2 (indicated by arrow 5). All encoder marks 4 are equal, and the distances between them are also equal, except in a region of row 3 in which an index marking is located (in the index marking, one or more encoding marks may be missing or inserted between the normally spaced encoding marks). A section 6 of the row 3 of encoder marks 4 is viewed by a sensor arrangement 7. The sensor arrangement 7 is mounted on a fixed structure, e.g. by a sensor support 8. In other embodiments, the encoder-mark row is fixed, whereas the sensor arrangement is mounted on the moving member and is thus moveable. Sensor output data is transferred to an analyzer 9 via a connection 10. Functional components of the analyzer 9 are a sensor input component 11, a comparator 12, a pattern memory 13, and a signal generator 14. The pattern memory 13 stores representations of predefined patterns of encoder marks 4 as well as pattern attributes which indicate whether a stored pattern represents an incremental pattern or an index pattern. The sensor output data is input via the input component 11. The comparator 12 compares the detected pattern of encoder marks 4 with all stored patterns. If it finds a match between the detected pattern and one of the stored patterns, it causes the signal generator 13 to generate an incremental-position-change signal 15 or an index signal 16, if the attribute of the matching stored pattern indicates that it is an incremental pattern or an index pattern.

In the angular encoder 1' of FIG. 2 the moving member is a rotating disk. Correspondingly, the advance direction illustrated by arrow 5' is a section of a circular line. The encoder marks 3' are arranged on the flat front of the rotating member 2', and are radially oriented. The sensor arrangement 7' is arranged to view the radially oriented encoder marks 3' on the face of the rotating member 2'. Regarding the analyzer 9, and the signals 15, 16 generated by it, reference is made to the analyzer's description made above in connection with FIG. 1.

Figure 3:
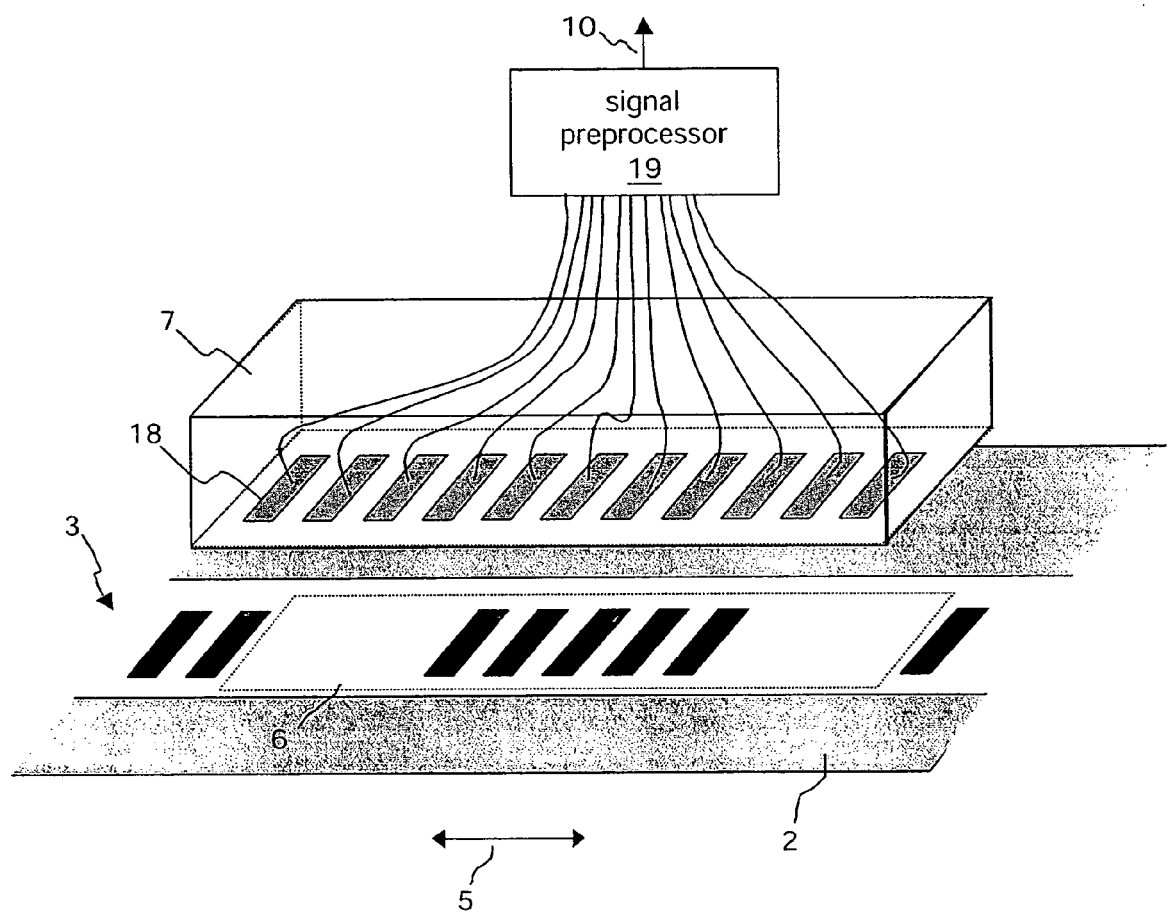
FIG. 3 schematically shows a sensor arrangement.

FIG. 3 illustrates an embodiment of the sensor arrangement 7 arranged to observe the section 6 of the row 3 of encoder marks 4. The sensor arrangement 7 has a plurality of individual sensor elements 18, each of which views a different field of row 3. The sensor elements 18, for example, are optical sensors indicative of the presence or absence of an encoder mark 4 within the respective viewed field. The pitch of the sensor elements 18 corresponds to the pitch of the encoder marks 4 (wherein in the regions of regular encoder-mark arrangement each encoder mark is followed by a blank space; accordingly, only every second sensor element 18 will see an encoder mark, as explained in connection with FIGS. 4 and 5 below). Furthermore, the size and orientation of the sensor elements 18 correspond to the ones of the encoder marks 4. Accordingly, the sensor arrangement 7 is adapted to the encoder-mark row 3 to detect patterns of encoder marks 4. The encoder marks 4 will gradually move into and out of the encoder-mark area viewed by each sensor element 18. A signal preprocessor 19 differentiates the sensor signals and performs suitable signal processing in order to provide only one signal when an encoder bar has moved into the respective viewed field and to define when this signal is triggered during this gradual movement (for example, the signal is triggered when the encoding mark and the field are coincident). Further, it combines the processed signals and forwards them to the analyzer 9 via line 10. In the example shown in FIG. 3, the sensor arrangement 7 has ten sensor elements 18. The exemplary encoder-mark row 3 shown in FIG. 3 is shown in such a position in which an index marking disturbing the regular arrangement of encoder marks 4 is viewed by the sensor arrangement 7, as will be explained in connection with FIG. 4.

Figure 4A:
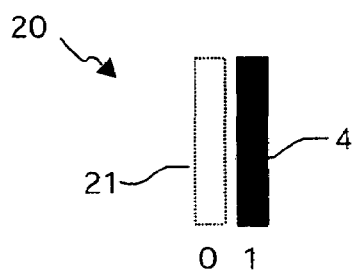
FIG. 4 illustrates an exemplary index marking, a regular arrangement of encoding marks, and a regular arrangement disturbed by the index marking.

FIG. 4a illustrates an incremental-encoder-mark unit 20 composed of an encoder mark 4 and a blank space 21. The encoder mark 4 and the blank space 21 are represented by "1" and "0", respectively. FIG. 4c illustrates a regular sequence of such units 20. This regular sequence is present in the row 3 of encoder bars 4 outside the region which bears the index marking. The period of this regular sequence (i.e. the distance between the center of two consecutive encoder marks 4) corresponds to one incremental position-change of the moving member. Incremental positions assigned to the incremental encoder-mark units 20 are also shown in FIG. 4c (denoted by "22"). A conventional encoder with a sensor which views and processes only single encoder marks would provide an incremental-position-change signal each time the center of an encoder mark (i.e. an incremental position 22 in FIG. 4c) passes by the sensor.

Figure 4B:
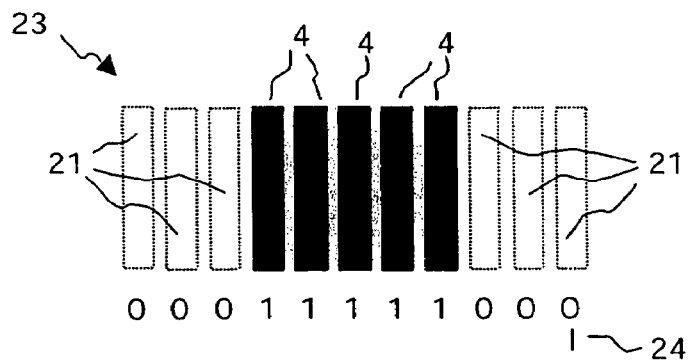
Figure 4C:
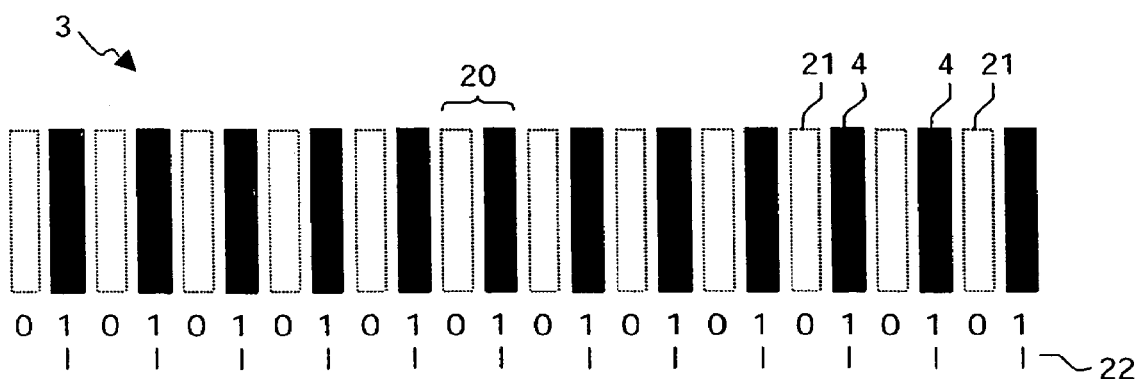

FIG. 4b illustrates an exemplary index marking 23. It has a length of eleven elements; it starts with three blank spaces 21, followed by five index markings 4, and is terminated by three blank spaces 21. Although the index marking 23 is a longitudinally extended object (longitudinally means "in the advance direction"), the moving member's reference position 24, which is indicated by the index marking, is, for example, at the center of the position of the leftmost of the three blank spaces 21 in FIG. 4b.

Figure 4D:
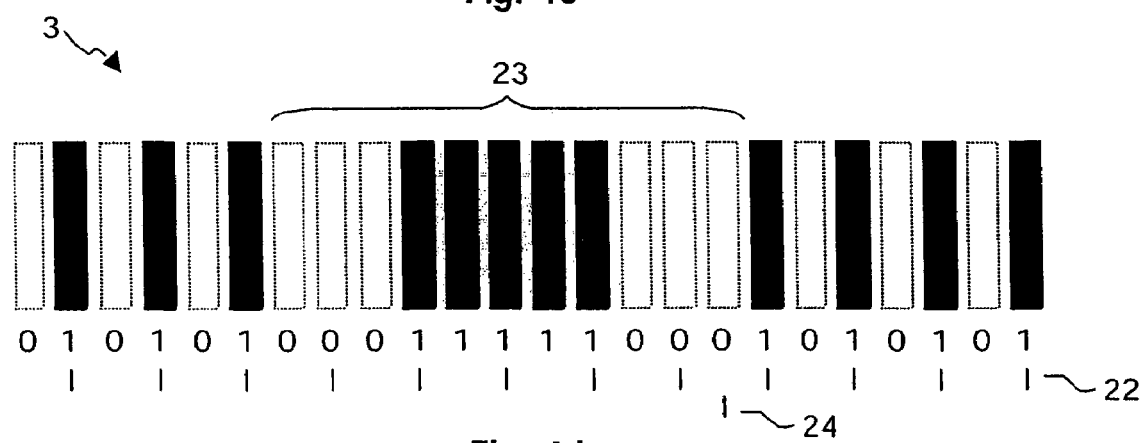

FIG. 4d illustrates that the index marking 23 is "embedded" in the regular arrangement of encoding marks 4 and blank spaces 21 of FIG. 4c. As can be seen, the regular arrangement is disturbed by the index marking 23. In the example of FIG. 4d, two encoding marks of the regular arrangement are removed (thereby forming the two blank-space triples) and two blank spaces of the regular arrangement are filled by encoder marks (thereby forming the five adjacent encoder marks). Also indicated in FIG. 4d is the reference-position 24 of the index marking and incremental positions 22. The latter can be reconstructed although two encoder marks 4 have been replaced by blank spaces 21 and two blank spaces 21 by encoder marks 4, as will be explained in connection with FIG. 5 below.

Incidentally, what is precisely considered as the "index marking" is a matter of definition: for example, as can be seen in FIG. 4d, a possible different definition might exclude the third blank space 21 at the right-hand side of the index marking 23 in FIG. 4d.

In other embodiments, the index marking is only formed by missing encoder marks, but no additional marks are inserted between the regularly arranged encoder marks, as in FIGS. 4b and 4d. In such embodiments, blank spaces may not be used to describe the incremental patterns and the index pattern, and sensor elements for viewing blank spaces in the regular arrangement may not be provided.

FIG. 5 illustrates the pattern-analysis operation and signal generation performed by the analyzer 9 (FIGS. 1 and 2). On the left-hand side of FIG. 5, all possible patterns are listed which may occur in the viewed section when the encoder-mark row of FIGS. 4c and 4d with the exemplary index marking 23 is moved past the sensor arrangement. There are, in total, twenty-one different possible patterns. The right-hand side of FIG. 5 is a Boolean operation table which maps the possible twenty-one patterns to a certain incremental and index signal output (wherein "0" indicates "no signal", and "1" indicates a "signal"). The patterns P1 and P2 are the regular patterns which appear when the regular part of the encoder-mark row is shifted past the sensor arrangement. If the first viewed field (i.e. the rightmost in FIG. 5) is an index mark, an incremental signal is generated, but if it is a blank space, no incremental signal is generated. The other patterns, P3 to P21 are irregular patterns which are detected by the sensor arrangement when the index marking of FIG. 4b is moved, field by field, into, and out of, the section viewed by the sensor arrangement. An incremental signal is generated every second pattern. When the index marking is completely within the viewed section (pattern P12), an index signal is generated. A further movement of the index mark row causes the index mark pattern to leave the viewed section (pattern P21), until the regular pattern P2 is observed again. In all cases except P12 no index signal is generated.

As can be seen in FIG. 5, the incremental-position-change information is redundantly contained in the regular patterns P1 and P2. In order to obtain the incremental-position-change information it would be sufficient to view only one field of the encoder-mark row. However, the use of a sensor arrangement viewing more fields enables the incremental signal to be generated even in that region of the encoder-mark row which is disturbed by the index marking (patterns P3 to P21). For example, if a sensor viewing only the first (right-most) field were used, no incremental signal would erroneously be generated for patterns P13 and P21 (although an incremental signal is due for these patterns), and erroneous incremental signals would be generated for patterns P16 and P18. Thus, viewing a pattern with a multiplicity of encoder marks and analyzing the observed pattern as to whether it matches one of the predefined incremental patterns, rather than viewing only one encoding mark, enables the incremental-position-change information to be reconstructed even from that region in which the regular arrangement is disturbed by the index marking. Incidentally, it is clear from FIG. 5 that the incremental patterns overlap since the pattern length is eleven fields, whereas the distance between incremental positions 24 (FIG. 4) only corresponds to two fields.

The pattern processing and signal generation illustrated in FIG. 5 is, for example, implemented in the analyzer as follows: the 20 different possible patterns P1 to P21 are stored in the pattern memory 13 (FIG. 1) together with the attributes indicating whether an incremental signal and/or an index signal is to be generated for the respective pattern. The comparator 12 (FIG. 2) compares a detected pattern with all stored patterns and tries to find that stored pattern which matches the detected pattern. Depending on the signal attribute of the matching pattern found, the signal generator 14 (FIG. 1) generates no signal, an incremental signal or an index signal (or both of them, see FIG. 8 below).

FIG. 5 illustrates an ideal case without pattern errors or detection errors. In practice, however, pattern and detection errors may occur, for example, if the row of encoder marks is contaminated by ink, or if a mark is erroneously detected due to noise. Then, other ("incorrect") patterns than ones shown in FIG. 5 may also be output by the sensor arrangement. In order to cope with such erroneous detections, that pattern of the set of "correct" patterns shown in FIG. 5 is assigned to a detected "incorrect" pattern which is closest to the detected pattern. In some embodiments, the closest "correct" pattern is found by a maximum likelihood estimation.

Figure 6:
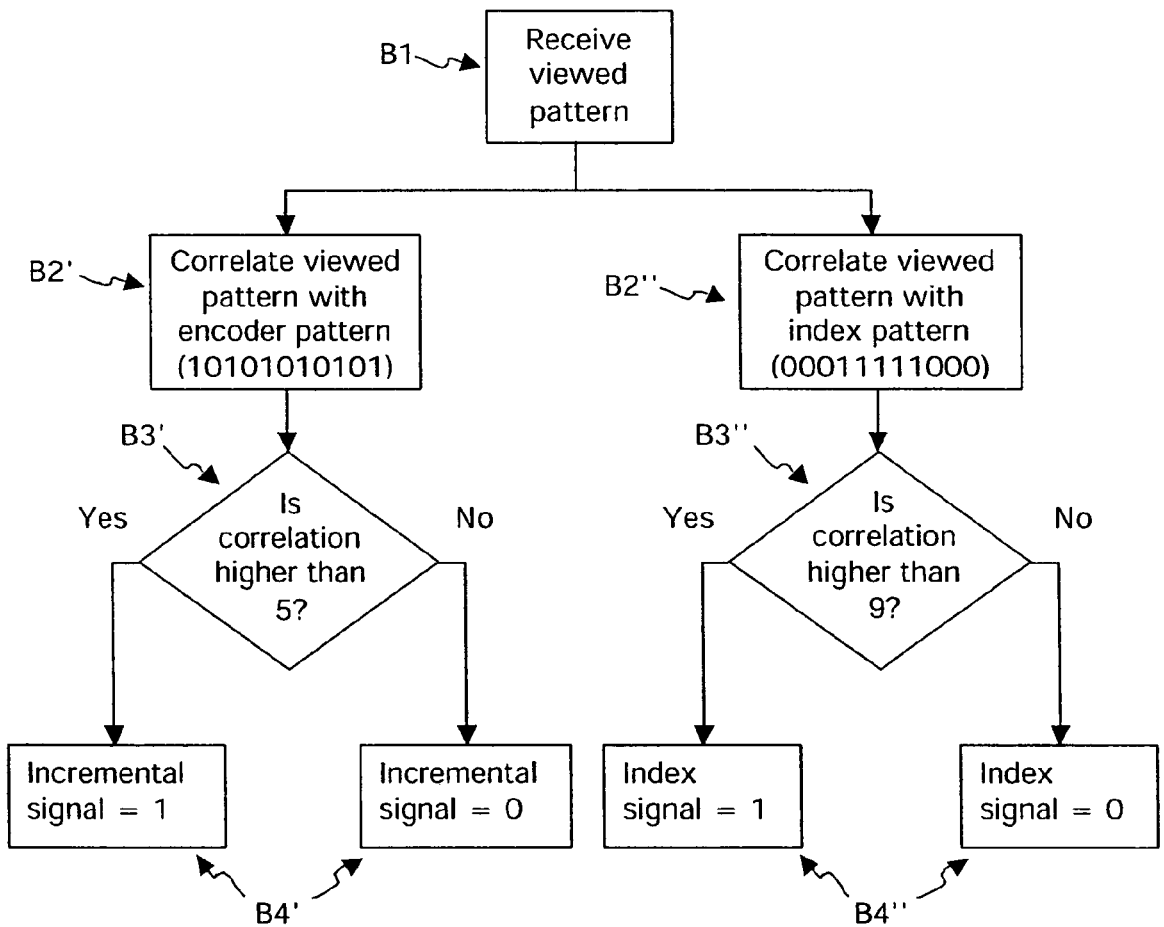
FIG. 6 shows a flow diagram of another embodiment of a pattern analyzer.

FIG. 6 shows a flow diagram of another embodiment of a pattern analyzer, based on calculating correlations between patterns. In block B1, a viewed pattern is received at the pattern analyzer. In block B2', the viewed pattern is correlated with the encoder pattern, which is "10101010101" in this example. "Correlating" means counting the number of same digits; therefore the correlation may go from 0 to 11. In block B2", the viewed pattern is correlated with the index pattern, which is "00011111000" in this example. In block B3' it is ascertained whether the correlation of the viewed pattern with the encoder pattern is higher than a certain threshold ("5" in the example of FIG. 6). If the outcome is positive an incremental signal is generated, if, however, it is negative, no incremental signal is generated (block B4'). In block B3" it is ascertained whether the correlation of the viewed pattern with the index pattern is higher than a certain other threshold ("9" in the example of FIG. 6). If the outcome is positive an index signal is generated, if, however, it is negative, no index signal is generated (block B4"). By appropriately choosing the thresholds, robustness against noise may be optimized. For example, if the index-pattern correlation threshold is set to 10, only correct readings of the index pattern cause the generation of an index signal. If it is set to a value smaller than 9, a wrong index signal generation may occur if one "1" of the index pattern is read as a "0". The robustness against noise may be increased by viewing a longer section of the row of encoder marks (for example 13 encoder marks, instead of the 11 marks shown in FIG. 6). The encoder-pattern correlation threshold is generally set to a smaller value, as illustrated in FIG. 6, since for a symmetric noise distribution, half of the length of the viewed encoder pattern is the optimal threshold. In case the noise distribution is not symmetrical, the optimal threshold would be higher or lower.

Figure 7:
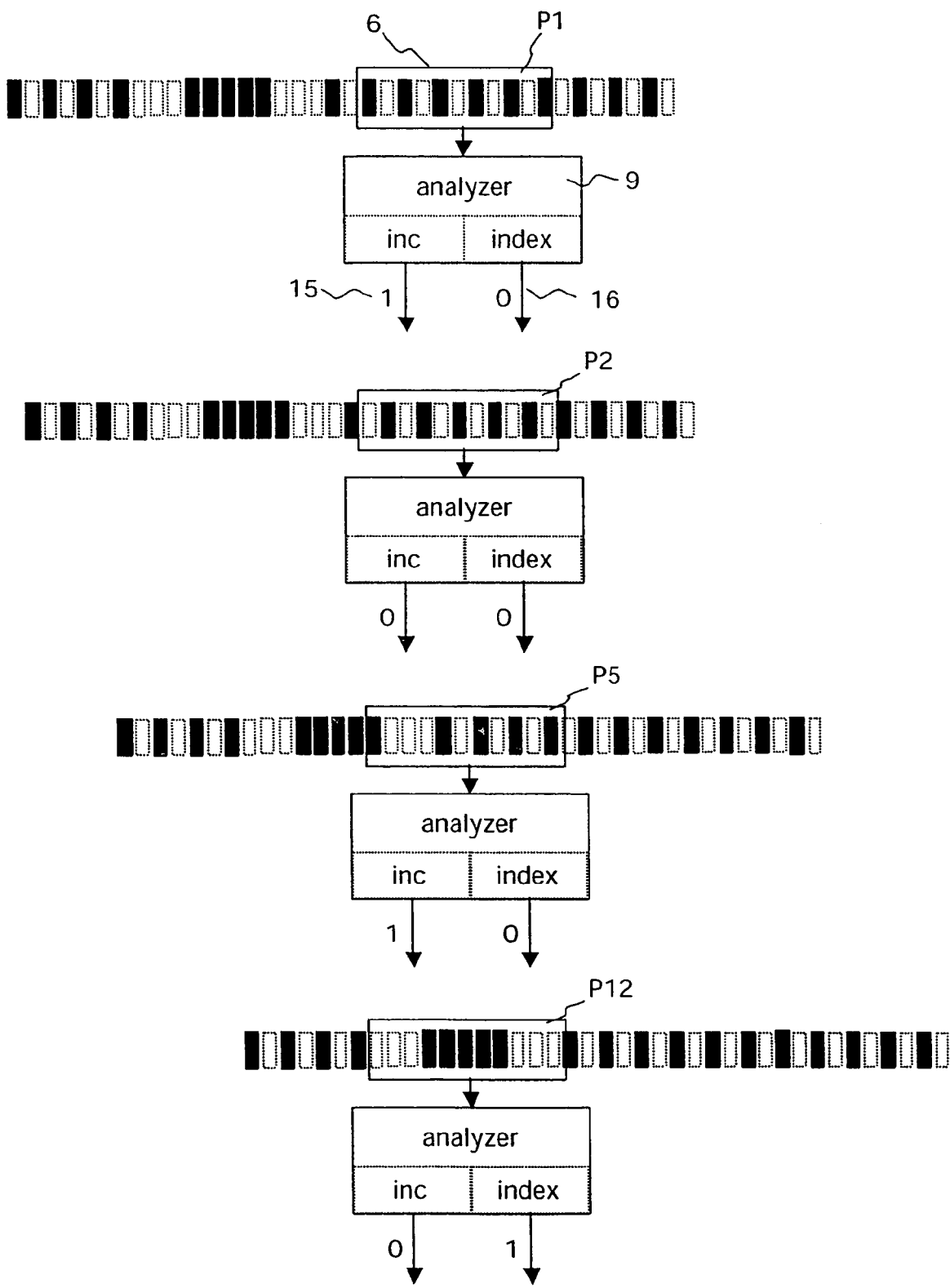
FIG. 7 illustrates a movement of an encoder mark with the index marking of FIGS. 4 and 5 past a sensor arrangement.

FIG. 7 illustrates how the encoder-mark row 3 of FIG. 4d is moved through the "window" of the sensor arrangement. Four different "snapshots" are shown, the viewed sections 6 of which correspond to patterns P1, P2, P5 and P12 of FIG. 5. As defined by the Boolean operation table of FIG. 5, incremental signals 15 are generated when the patterns P1 and P5 are moved into the sensor arrangement's window, and an index signal is generated when the pattern P12 is moved into it.

Figure 8:
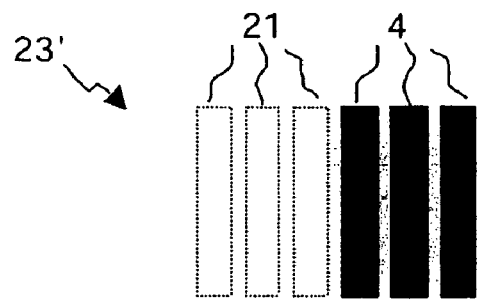
FIG. 8 shows different viewed pattern and illustrates signal generation similar to FIG. 5, but for another exemplary index marking.

FIG. 8 illustrates a pattern analysis and signal generation analogous to FIG. 5, but for another example of an index marking denoted by 23'. The index marking 23' has a length of six elements, it is composed of three encoder marks 4, followed by three blank spaces 21. Eleven different patterns, denoted by R1 to R11 in FIG. 8, can be observed when a regular arrangement (as shown in FIG. 4c) is overlaid with the index marking 23', and when such an encoder-mark row is moved past the detector arrangement (which, in this example, views only six elements). The pattern processing and signal generation corresponds to what has been described in connection with FIG. 5, which illustrates that it is independent of the particular pattern chosen for the index marking. Incidentally, one difference due to the different pattern chosen can be seen in pattern R7: both the incremental signal and the index signal are generated for pattern R7, whereas only the index signal, but no incremental signal is generated for the corresponding pattern P12 of FIG. 5.

Figure 9:
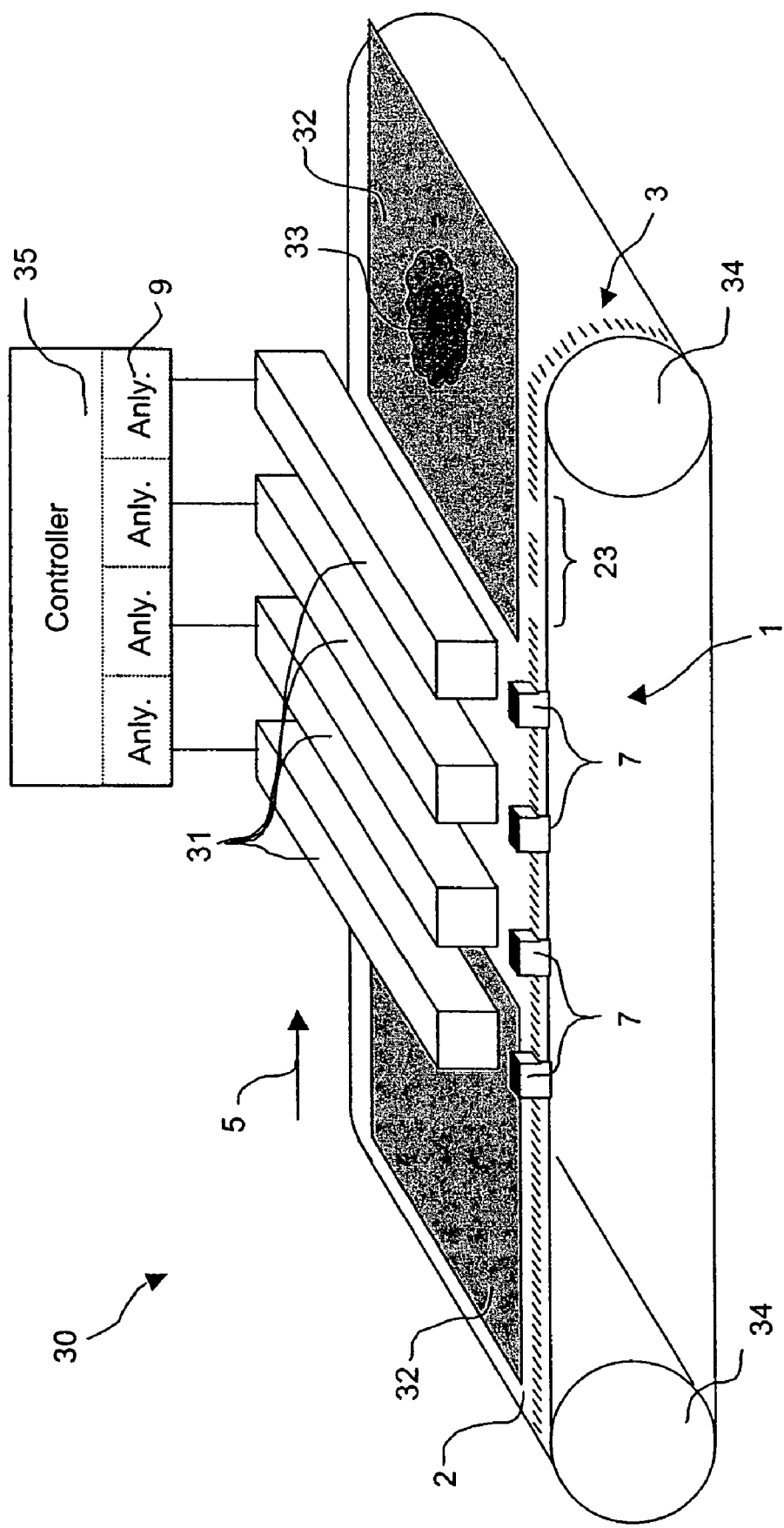
FIG. 9 illustrates a printing device equipped with a linear-encoding system of FIGS. 1, 2 to 8.

FIG. 9 illustrates a printing device 30 equipped with the linear-encoding system 1 of FIGS. 1, 3 to 7. The printing device 30 is a multicolor printer with separate print bars 31 for the different colors to be printed (for example, cyan, magenta, yellow and black). The print bars 31 extend over the full width of a print medium 32, for example paper sheets (an already printed multicolor image is shown at 33 in FIG. 9). The exemplary printer of FIG. 9 is an ink-jet printer; other embodiments use other printing technologies, such as laser printing, dye sublimation printing, thermal way printing, solid ink printing, etc.

The multicolor image to be printed is virtually separated into single-color images to be printed by the respective single-color print bars 31 (some embodiments have redundant print bars, for example, two print bars for each color; in these embodiments, the single-color image to be printed is subdivided between the print bars of the same color, for example, by use of appropriate print masks; other embodiments even have multicolor print bars). In order to achieve high image quality, the individual single-color images are printed onto the recording medium 32 onto each other in an aligned manner, which is also called "registering" the images. Since the print bars 31 are spaced in the recording-medium-advance direction 5, the different single-color images are printed one after the other, and the downstream print bars need to "know" where the first print bar printed its image onto the recording medium 32 in order to achieve precise image registration. This is accomplished by the encoding system described above.

The printing device 30 has a moving member 2 in the form of a conveying belt guided by rollers 34, at least one of which is driven (in other embodiments, the moving member is a rotating drum). The row 3 of encoder marks 4 is arranged at one edge of the belt and parallel to it. The encoder marks 4 are, for example, printed onto the belt or a strip attached to the belt (or the drum). The encoder marks 4 are oriented perpendicular to the advance direction 5 and are regularly arranged. An index marking 23 forms a disturbance of their regular arrangement, as described above. Each print bar 31 is equipped with an individual sensor arrangement 7 which views a section of the encoder-mark row 3 to provide print-bar-individual information about the relative and absolute belt position. This information is used to individually register the images printed by the print bars 31. A controller 35 controls the print activity of individual dot-forming elements (e.g. ink nozzles in an ink-jet printer) of the print bars 31 to print the required image. The controller 35 controls the print activity such that each of the print bars 31 downstream of the first print bar 31 prints its image in a registered manner onto the first print bar's image. An analyzer 9 of the kind described above is provided for each print bar 31. The analyzers 9 are components of the controller 35; they are, for example, implemented as analyzer processes executed by the controller 35 simultaneously with other processes (e.g. the process controlling the nozzle activity). The signals representing encoder marks detected by the sensor arrangements 7 are input to the controller 35, and the analyzers 9 generate the incremental and index signals for each print bar 31 based on these sensor signals, as described above. In other embodiments, the print bars 31 are equipped with individual analyzer devices or a common analyzer device dedicated to process the detected encoder-mark patterns and generate the print-bar-individual incremental and index signals which are supplied to the controller 35.

The index and incremental signals are, for example, used to register the print bar's images in the following way: an incremental counter is assigned to each print bar. When the index marking 23 moves past a print bar 31 and is detected by the print bar's sensor arrangement 7 so that an index signal is generated for this print bar, the print bar's incremental counter is set to a reference value (for example to "0"). Each incremental signal due to a subsequent detection of an incremental pattern at this print bar causes the print bar's incremental counter to be incremented. Accordingly, the current content of each of the counters represents the current position of the belt (and, consequently, of the recording medium 32 on the belt; it is assumed that the recording medium does not move relative to the belt which is a reasonable assumption in many applications) relative to a common reference point (i.e. the reference position of the index marking 23). When the first print bar 31 starts printing its image onto the recording medium 32 at a certain count of its associated incremental counter, the controller 35 controls the print action of the subsequent print bars 31 such that they also start to print their respective image when the same count is reached in their respective incremental counter. In this way, registration of the different images to be printed is accomplished.

The embodiments described enable relative position information (based on incremental signals) and absolute position information (based on index signals) to be obtained with a smaller relative error than in conventional systems which used different sensors or encoder marks of different shape or size to distinguish between incremental and index markings.

All publications and existing systems mentioned in this specification are herein incorporated by reference.

Although certain methods and products constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. An encoding system for determining position and position changes of a moving member, comprising:
   a sequence of encoder marks forming incremental patterns and at least one index pattern, wherein two subsequent incremental patterns are indicative of an incremental position-change of the moving member and the index pattern is indicative of a reference position of the moving member;
   a sensor configured to view a section of the encoder-mark sequence, wherein the viewed section of the encoder-mark sequence carries redundant incremental position-change information at least in regions not disturbed by the index pattern; and
   an analyzer arranged to analyze an encoder-mark pattern in the viewed section with regard to the incremental patterns and the index pattern and to generate, in response to a pattern match found, an incremental-position-change signal and an index signal, wherein the signals are generated only after confirming a correlation greater than selected thresholds between the encoder-mark pattern and the incremental patterns and the index pattern.

2. The encoding system of claim 1, wherein the analyzer verifies a correlation between the viewed section and the index pattern to be higher than a threshold as a condition of the index signal.

3. The encoding system of claim 1, wherein the length of the viewed section is larger than a length of the index pattern.

4. The encoding system of claim 1, wherein analyzer ascertains whether a correlation between the viewed section and the encoder pattern is higher than a threshold as a condition of the incremental-position-change signal.

5. The encoding system of claim 1, wherein the analyzer sets a detected pattern to a correct pattern closest to the detected pattern.

6. The encoding system of claim 1, wherein a length of the viewed section of the sequence of encoder marks is selected according to a desired robustness-of the encoding system.

7. An encoding system for determining position and position changes of a moving member, comprising:
   a row of encoder marks arranged along the moving member in a generally regular manner to provide incremental position-change information;
   at least one index marking in the form of a predefined pattern of encoder marks which represents a disturbance of the regular encoder-mark arrangement;
   a sensor arrangement viewing a section of the row of encoder marks and arranged to provide a viewed pattern of the encoder-mark section;
   an analyzer arranged to analyze the viewed pattern to generate incremental-position-change signals in response to detection of the encoder marks and an index signal in response to a detection of the index marking, wherein the incremental-position-change signals and the index signal are generated only after the analyzer has verified a correlation greater than selected thresholds between the viewed pattern and the index marking or the encoder marks.

8. The encoding system of claim 7, wherein robustness of the encoding system against noise is increased by viewing a longer section of the row of encoder marks.

9. The encoding system of claim 7, wherein incremental-position-change signals are generated by use of the viewed section, even when the viewed section is disturbed by the index mark pattern.

10. The encoding system of claim 7, wherein the sensor arrangement is arranged to detect, in the viewed section, a multiplicity of encoder marks, so that the detected encoder marks carry redundant incremental position-change information at least in regions of regular encoder-mark arrangement, wherein the detection of the multiplicity of encoder marks enables the incremental-position-change signals to be generated also in that section of the encoder-mark row in which the regular encoder-mark arrangement is disturbed by the index marking.

11. The encoding system of claim 7, wherein the incremental-position-change signals are generated only after confirming a correlation between the viewed section and an encoder pattern that is greater than a second threshold.

12. The encoding system of claim 7, wherein the analyzer sets a detected pattern to a correct pattern closest to the detected pattern.

13. The encoding system of claim 7, wherein a length of the viewed section is larger than a length of the index mark pattern.

14. An encoding system for determining position and position changes of a moving member, comprising:
   a row of identical encoder marks forming incremental patterns and at least one index pattern, wherein two subsequent incremental patterns are indicative of an incremental position-change of the moving member and the index pattern is indicative of a reference position of the moving member;
   a sensor arrangement detecting a pattern of a section of the encoder-mark row;
   an analyzer arranged to analyze the pattern of the section of the encoder-mark row detected by the sensor arrangement with regard to the incremental patterns and the index pattern and to generate, in response to an incremental-pattern match found, an incremental-position-change signal and, in response to an index-pattern match found, an index signal, wherein the analyzer generates the signals only after verifying a correlation greater than selected thresholds between the section of the encoder-mark row detected by the sensor arrangement and the index pattern, and between the section of the encoder-mark row detected by the sensor arrangement and the incremental pattern.

15. The encoding system of claim 14, wherein the analyzer sets a detected pattern to a correct pattern closest to the detected pattern.

16. The encoding system of claim 14, wherein a length of the section of the encoder mark sequence viewed by the sensor arrangement is selected according to a desired robustness of the encoding system.

17. The encoding system of claim 14, wherein the sensor arrangement comprises a sensor element arranged to successively detect the encoder marks or groups of the encoder marks in the section of the encoder-mark row upon the movement of the moving member, wherein the encoding system is arranged to combine the successively detected encoder marks to form the detected encoder-mark pattern.

18. The encoding system of claim 14, wherein subsequent incremental patterns overlap.

19. The encoding system of claim 14, wherein a length of the section of the encoder-mark row viewed by the sensor arrangement is sufficient to enable incremental-position-change information to be generated even when the section is disturbed by the index pattern.

20. A printing device having an encoding system for determining position and position changes of a recording medium conveyor to determine the position of a recording medium placed on the conveyor, comprising:
 a sequence of encoder marks forming incremental patterns and at least one index pattern, wherein two subsequent incremental patterns are indicative of an incremental position-change of the conveyor and the index pattern is indicative of a reference position of the conveyor;
 a sensor arrangement viewing a section of the encoder-mark sequence, the length of which is greater than one position-change increment;
 an analyzer arranged to analyze an encoder-mark pattern in the viewed section with regard to the incremental patterns and the index pattern and to generate, in response to a pattern match found, an incremental-position-change signal and an index signal, wherein the incremental-position-change signal and the index signal are generated only after confirming a correlation greater than selected thresholds between the viewed section and an incremental pattern or the index pattern, respectively.

21. The printing device of claim 20, wherein the recording medium conveyor is a belt conveyor.

22. The printing device of claim 20, wherein the encoder-mark sequence is an encoder-mark row arranged along the recording medium conveyor.

23. The printing device of claim 20, wherein the printing device has a plurality of print stations arranged along the recording medium conveyor, and each print station is individually equipped with said sensor arrangement and analyzer.

24. The printing device of claim 20, wherein the printing device is a page-wide ink-jet printer.

25. A printing device having an encoding system for determining position and position changes of a recording medium conveyor to determine the position of a recording medium placed on the conveyor, comprising:
 a row of encoder marks arranged along the conveyor in a generally regular manner to provide incremental position-change information;
 at least one index marking in the form of a predefined pattern of encoder marks which represents a disturbance of the regular encoder-mark arrangement;
 a sensor arrangement viewing a section of the row of encoder marks and arranged to provide a viewed pattern of the encoder-mark section;
 an analyzer arranged to analyze the viewed pattern to generate incremental-position-change signals on the basis of the encoder marks and an index signal in response to a detection of the predefined index mark pattern, wherein the analyzer is configured to extract redundant incremental position-change information from the viewed section of the row of encoder marks at least in regions not disturbed by the index pattern,
 wherein the incremental-position-change signals are enabled to be generated also in that section of the encoder-mark row in which the regular encoder-mark arrangement is disturbed by the index marking; and
 wherein the analyzer sets the viewed pattern to a correct pattern closest to the viewed pattern.

26. The printing device of claim 25, wherein the recording medium conveyor is a belt conveyor.

27. The printing device of claim 25, wherein the printing device has a plurality of print stations arranged along the recording medium conveyor, and each print station is individually equipped with said sensor arrangement and analyzer.

28. The printing device of claim 25, wherein the printing device is a page-wide ink-jet printer.

29. A printing device having an encoding system for determining position and position changes of a recording mediun conveyor to determine the position of a recording medium placed on the conveyor, comprising:
 a row of identical encoder marks forming incremental patterns and at least one index pattern, wherein two subsequent incremental patterns are indicative of an incremental position-change of the conveyor and the index pattern is indicative of a reference position of the conveyor;
 a sensor arrangement detecting a pattern of a section of the encoder-mark row;
 an analyzer arranged to analyze the detected encoder-mark pattern with regard to the incremental patterns and the index pattern and to generate, in response to an incremental-pattern match found, an incremental-position-change signal and, in response to an index-pattern match found, an index signal, wherein the incremental-position-change signal and the index signal are generated only after confirming a correlation greater than selected thresholds between the detected pattern and an incremental pattern or the index pattern, respectively.

30. The printing device of claim 29, wherein the recording medium conveyor is a belt conveyor.

31. The printing device of claim 30, wherein the encoder-mark row is arranged along the recording medium conveyor.

32. The printing device of claim 30, wherein the printing device has a plurality of print stations arranged along the recording medium conveyor, and each print station is individually equipped with said sensor arrangement and analyzer.

33. The printing device of claim 30, wherein the printing device is a page-wide ink-jet printer.

34. A method of determining position and position changes of a moving member using a sequence of encoder marks which forms incremental patterns and at least one index pattern, wherein two subsequent incremental patterns are indicative of an incremental position-change of the moving member and the index pattern is indicative of a reference position of the moving member, comprising the steps:

viewing a section of the encoder-mark sequence, wherein the viewed section carries redundant incremental position-change information at least in regions not disturbed by the index pattern and the length of the section is greater than one position-change increment;

analyzing a encoder-mark pattern in the viewed section with regard to the incremental patterns and the index pattern, wherein in response to an incorrect detected pattern in the viewed section, the incorrect detected pattern is set to a correct pattern closest to the incorrect detected pattern; and generating, in response to a pattern match found, an incremental-position-change signal and an index signal.

35. A method of determining position and position changes of a moving member using a row of encoder marks arranged along the moving member in a generally regular manner to provide incremental position-change information; at least one index marking in the form of a predefined pattern of encoder marks which represents a disturbance of the regular encoder-mark arrangement, comprising the steps:

viewing a section of the row of encoder marks, wherein the section viewed has a length selected according to a desired robustness of the encoding system;

providing a viewed pattern of the encoder-mark section, wherein the viewed pattern of the encoder-mark section carries redundant incremental position-change information at least in regions not disturbed by the index pattern;

analyzing the viewed pattern to generate incremental-position-change signals providing the incremental position-change information on the basis of the encoder marks and an index signal in response to a detection of the pre-defined index mark pattern, wherein in response to an incorrect detected pattern in the viewed section, the incorrect detected pattern is set to a correct pattern closest to the incorrect detected pattern;

wherein the incremental-position-change signals are enabled to be generated also in that section of the encoder-mark row in which the regular encoder-mark arrangement is disturbed by the index marking.

* * * * *

UNITED STATES PATENT AND TRADEMARK OFFICE
CERTIFICATE OF CORRECTION

| | |
|---|---|
| PATENT NO. | : 7,129,858 B2 |
| APPLICATION NO. | : 10/683817 |
| DATED | : October 31, 2006 |
| INVENTOR(S) | : Jordi Ferran et al. |

It is certified that error appears in the above-identified patent and that said Letters Patent is hereby corrected as shown below:

In column 13, line 65, in Claim 6, delete "robustness-of" and insert -- robustness of --, therefor.

In column 16, line 32, in Claim 29, delete "mediun" and insert -- medium --, therefor.

Signed and Sealed this

Fifteenth Day of June, 2010

David J. Kappos
*Director of the United States Patent and Trademark Office*